(12) United States Patent
Lee et al.

(10) Patent No.: US 7,002,805 B2
(45) Date of Patent: Feb. 21, 2006

(54) THERMAL ENHANCE MCM PACKAGE AND MANUFACTURING METHOD THEREOF

(75) Inventors: Shih-Chang Lee, Kaohsiung (TW); Su Tao, Kaohsiung (TW); Chian-Chi Lin, Tainan (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/747,037

(22) Filed: Dec. 30, 2003

(65) Prior Publication Data

US 2004/0150102 A1 Aug. 5, 2004

(30) Foreign Application Priority Data

Dec. 30, 2002 (TW) .............................. 91137926 A

(51) Int. Cl.
*H05K 7/20* (2006.01)
(52) U.S. Cl. ...................... 361/704; 361/707; 361/719; 361/721; 257/706; 257/707
(58) Field of Classification Search ................ 361/704, 361/707, 709–712, 717–719, 818; 257/704, 257/706, 707, 712, 713; 174/52.1, 252
See application file for complete search history.

(56) References Cited

U.S. PATENT DOCUMENTS

| | | | | |
|---|---|---|---|---|
| 5,396,403 | A | * | 3/1995 | Patel ........................... 361/705 |
| 5,585,671 | A | * | 12/1996 | Nagesh et al. ............... 257/697 |
| 5,600,541 | A | * | 2/1997 | Bone et al. .................. 361/707 |
| 5,694,300 | A | * | 12/1997 | Mattei et al. ................ 361/818 |
| 6,292,369 | B1 | * | 9/2001 | Daves et al. ................. 361/719 |
| 6,297,960 | B1 | * | 10/2001 | Moden et al. ............... 361/719 |
| 6,331,731 | B1 | * | 12/2001 | Kelly et al. .................. 257/704 |
| 6,426,877 | B1 | * | 7/2002 | Baba ............................ 361/760 |
| 6,437,240 | B1 | * | 8/2002 | Smith .......................... 174/52.2 |
| 6,525,943 | B1 | * | 2/2003 | Moden et al. ............... 361/719 |
| 6,653,730 | B1 | * | 11/2003 | Chrysler et al. ............. 257/704 |
| 6,665,187 | B1 | * | 12/2003 | Alcoe et al. ................. 361/719 |

* cited by examiner

*Primary Examiner*—Boris Chervinsky
(74) *Attorney, Agent, or Firm*—Bacon & Thomas, PLLC

(57) ABSTRACT

A thermal enhance multi-chips module (MCM) package mainly comprises a first package, a first carrier, a second package, a second carrier, an intermediate substrate and a cap-like heat spreader. The intermediate substrate has an opening. The first carrier and the second carrier are electrically connected to the first package and the second package respectively. The second package is accommodated in the opening and electrically connected to the first package via the first carrier, the second carrier and the intermediate carrier. The cap-like heat spreader has a supporting portion and an alignment portion wherein the supporting portion is connected to the alignment portion to define a cavity. The cavity not only accommodates the first package, the first carrier, the second package, the second carrier and the intermediate substrate but also provides alignment mechanism by the supporting portion and the alignment portion to prevent the dislocation after all the components of the thermal enhance MCM package are connected with each other. Furthermore, the first carrier has a first side and the second carrier has a second side. The first side and the second side both have grounding portions, for example recessed portions and metal layers, for providing a ground shielding of the first package and the second package against the outside. In addition, the grounding portions also provide thermal paths to increase the ability of the heat dissipation. Besides, a method for manufacturing the thermal enhance MCM package is provided.

12 Claims, 4 Drawing Sheets

THERMAL ENHANCE MCM PACKAGE AND MANUFACTURING METHOD THEREOF

BACKGROUND OF THE INVENTION

1. Field of Invention

This invention relates to a thermal enhance multi-chips module (MCM) package. More particularly, the present invention is related to a thermal enhance MCM package having a cap-like heat spreader and a manufacturing method thereof.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multichips module) package is commonly used in the assembly package and electronic devices. Usually, the MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, as shown in FIG. 1, it illustrates the top view of a conventional assembly package in a side-by-side type. Two assembly packages 11 and 12 are disposed on a carrier 13, for example an organic substrate, in parallel with each other, and electrically connected to external electronic devices through electrically conductive devices 14, for example, solder balls. Moreover, the multi-chips module assembly package (MCM assembly package) may be an assembly package in a stacked type as shown in FIG. 2 or an assembly package with an intermediate substrate 20 therein as shown in FIG. 3 and FIG. 4.

As shown in FIG. 2, a first assembly package 21 comprises a first substrate 211 and a first chip 212, wherein the first chip 212 is flip-chip bonded to and electrically connected to the first substrate 211; and a second assembly package 22 comprises a second substrate 221 and a second chip 222 which is flip-chip bonded to and electrically connected to the second substrate 221. Therein, the first package 21 and the second package 22 can also be wirebond packages. In addition, the first package 21 further comprises a first electrically conductive device 213, for example a solder ball, mounted on the lower surface of the first substrate 221 to electrically connect to the second package 22 through the second substrate 221. Similarly, the second package 22 further comprises a second conductive device 223 formed on the lower surface of the second substrate 221 to transmit the electrical signals from the first package 21 and the second package 22 to an external device. In general, the first assembly package 21 connects to the second assembly package 22, and then secures to the second assembly package after reflowing the solder balls 213. However, before performing the reflowing process, the solder balls 213 may not align with the pads on the lower surface of the first substrate 211 and the pads on the upper surface of the second substrate 221. In such a manner, the first assembly package 21 will not electrically connect to the second assembly package well.

Next, referring to FIG. 3 and FIG. 4, which illustrate another stacked-type assembly package. It should be noted that the reference numeral of each element in FIGS. 3 and 4 corresponds to the same reference numeral of each element in FIG. 2. There is an opening 201 formed in an intermediate substrate 20; the second chip 222 of the second assembly package 22 is disposed in the opening 206 and electrically connected to the first package 21. Therein, the first package 21 comprises a first electrically conductive device 213, for example a solder ball, formed on the lower surface of the first substrate 211 to electrically connect to the intermediate substrate 20, and the lower surface of the intermediate substrate 20 has a third electrically conductive device 23 formed thereon to electrically connect to the second assembly package 22. In addition, the second assembly package 22 further comprises a second electrically conductive device 223 formed on the lower surface of the second substrate 221 to transmit the electrical signals from the first package 21 and the second package 22 to an external device through the intermediate substrate 20.

As mentioned above, the second assembly package 22 secures to the intermediate substrate 20 by reflowing the solder balls 23. Similarly, the first assembly package 21 secures to the intermediate substrate 20 by reflowing the solder balls 213. However, before the solder balls 23 and 213 are secured to the first assembly package 21 and the second assembly package 22, the solder balls 23 may not align with the pads on the lower surface of the first substrate 211 and the pads on the upper surface of the intermediate substrate 20 and the solder balls 213 may not align with the pads on the lower surface of the intermediate substrate 20 and the pads on the upper surface of the second substrate 221. In such a manner, the first assembly package 21 will not electrically connect to the intermediate substrate well, and the second assembly package 22 will also not electrically connect to the intermediate substrate well. Besides, the first assembly package 21 is secured to the intermediate substrate 20 after the second assembly package securing to the intermediate by reflowing the solder balls 23, so the assembly cost and assembly time for manufacturing above-mentioned MCM package will be increased.

Therefore, providing another assembly package to solve the mentioned-above disadvantages is the most important task in this invention.

SUMMARY OF THE INVENTION

In view of the above-mentioned problems, an objective of this invention is to provide a thermal enhance MCM package to have the solder balls in alignment with the corresponding solder ball pads and to solve the problem of dislocation when the solder balls connects the other electronic devices.

To achieve the above-mentioned objective, a thermal enhance multi-chips module (MCM) package is provided, wherein the MCM package mainly comprises a first assembly package, a second assembly package, a first carrier, a second carrier, an intermediate substrate and a cap-like heat spreader. Therein, the intermediate substrate is interposed between the first assembly package and the second assembly package. The MCM package is characterized in that the cap-like heat spreader has a supporting portion and an alignment portion wherein the supporting portion connects the alignment portion to form a cavity for accommodating the first assembly package, the second assembly package, the first carrier, the second carrier and the intermediate substrate. Accordingly, the first carrier and the second carrier contacts the alignment portion of the cap-like heat spreader, and the first assembly is attached to the supporting portion of the cap-like heat spreader via an thermally conductive adhesive. Consequently, the cap-like heat spreader can cause the solder balls align with the pads of the first carrier and the second carrier so as to make the electrical connection between the electronic devices better in the MCM package. In addition, the cap-like heat spreader can help align the solder balls with the pads of the first carrier, the second carrier and the intermediate carrier so as to make the first assembly package, the second package and the intermediate carrier connect with each other in one reflow process and simplify the manufacturing process.

In accordance with this invention and as shown above, the side surfaces of the first carrier, the second carrier and the intermediate substrate further have grounding portions for providing another heat dissipation paths and shielding devices. Therein, the grounding portions may be grounding circuits or grounding layers.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
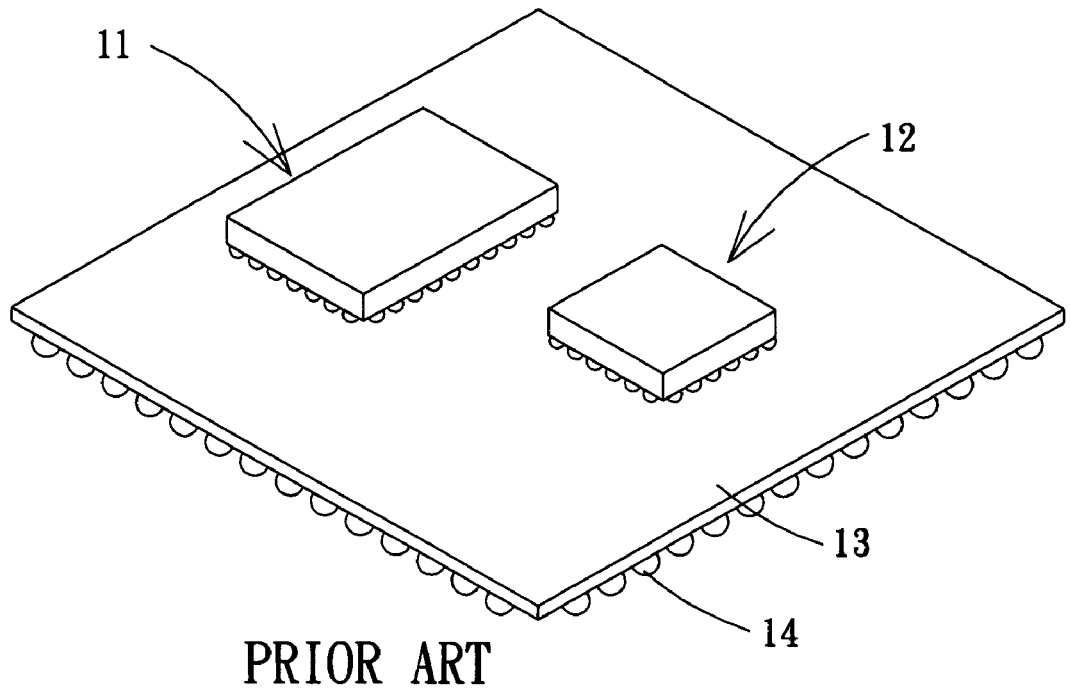
FIG. 1 is a top view of the conventional multi-chips module assembly package in a side-by-side type.
Figure 2:
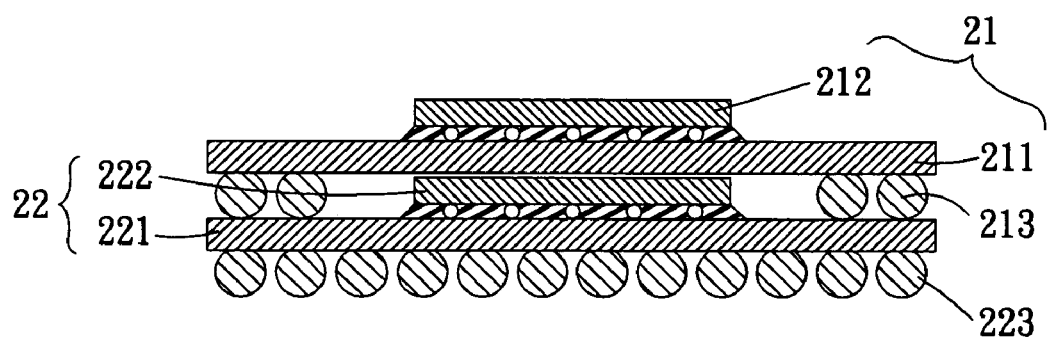
FIG. 2 is a cross-sectional view of another conventional multi-chips module assembly package in a stacked type.
Figure 3:
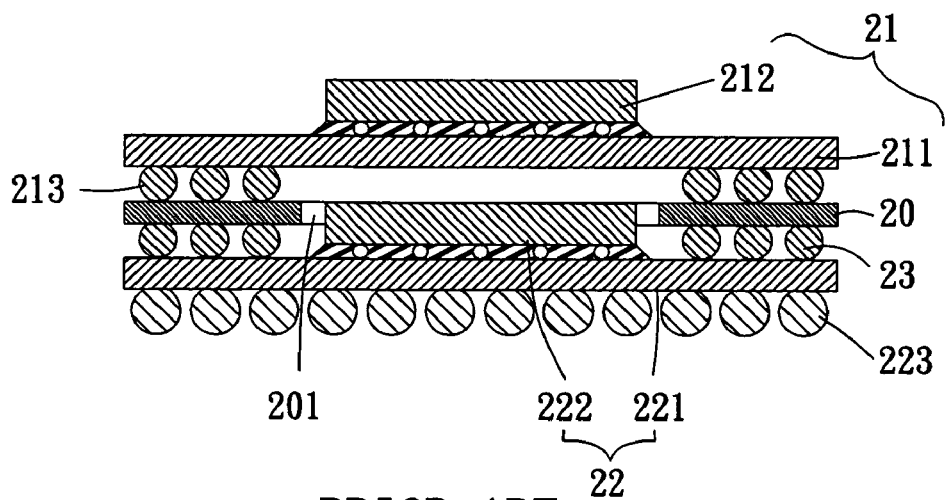
FIG. 3 is a cross-sectional view of another conventional multi-chips module assembly package with an intermediate substrate in a stacked type.
Figure 4:
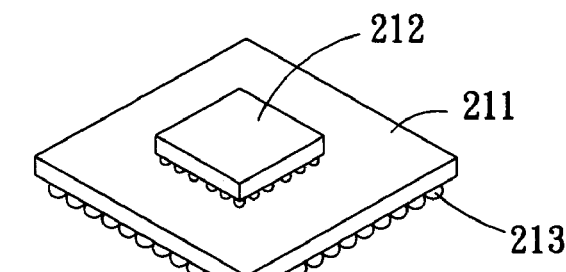
FIG. 4 is an exploded view of the conventional multi-chips module assembly package according to FIG. 3.
Figure 4:
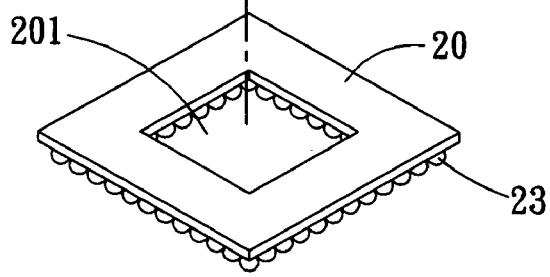
Figure 4:
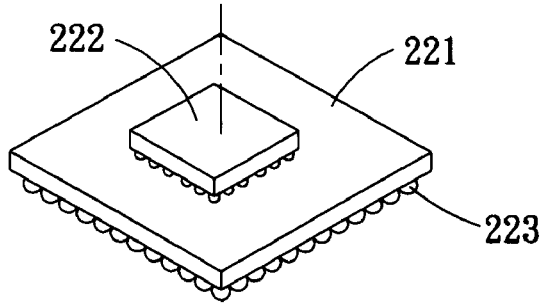
Figure 5:
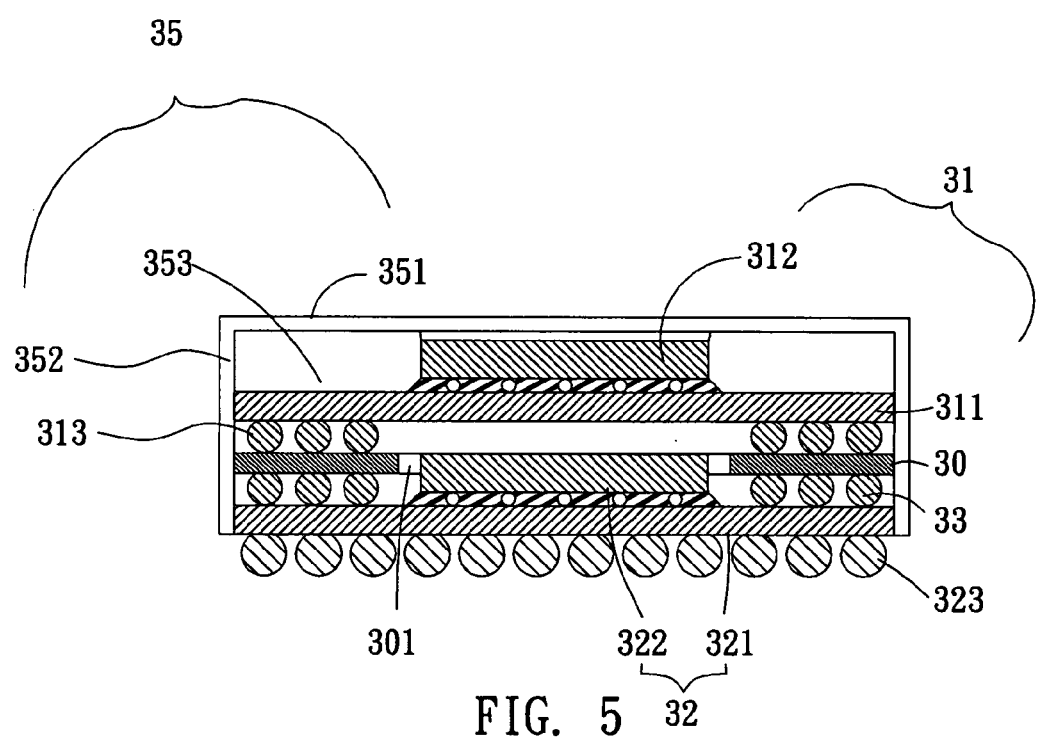
FIG. 5 is a cross-sectional view of a thermal enhance multi-chips module assembly package with a cap-like heat spreader according to the first embodiment of the present invention.

The thermal enhance MCM package according to the preferred embodiment of this invention will be described herein below with reference to the accompanying drawings, wherein the same reference numbers refer to the same elements.

In accordance with a first preferred embodiment as shown if FIG. 5, FIG. 6A, FIG. 6B and FIG. 6C, there is provided a thermal enhance MCM package. The thermal enhance MCM package mainly comprises an intermediate substrate 30, a first assembly package 31, a second assembly package 32, and a cap-like heat spreader 35. The first assembly package 31 at least comprises a first substrate 311 and a first chip 312 mounted on the first substrate 311 by flip-chip bonding. Similarly, the second assembly package 32 at least comprises a second substrate 321 and a second chip 322 mounted on the second substrate 321 by flip-chip bonding.

In addition, the intermediate substrate 30 connects the first assembly package and the second assembly package through the solder balls 313 and 33 respectively. Moreover, the intermediate substrate 30 further has an opening 301 formed therein so as to accommodate the second assembly package 32. Besides, the cap-like heat spreader 35 further has a supporting portion 351 and an alignment portion 352, and the supporting portion 351 and alignment portion 352 define a cavity 353 for accommodating the first chip 312, the second chip 322, the first substrate 311, the second substrate 321 and the intermediate substrate 30.

Figure 6A:
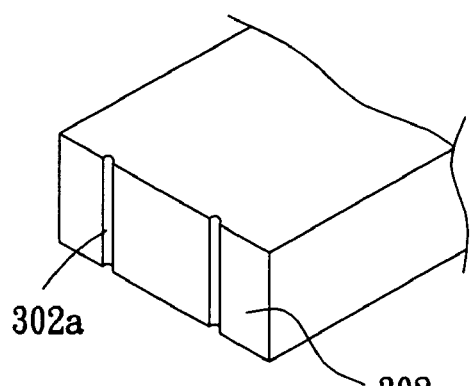
FIG. 6A is a cross-sectional view of a cap-like heat spreader with a grounding portion according to FIG. 5.
Figure 6B:
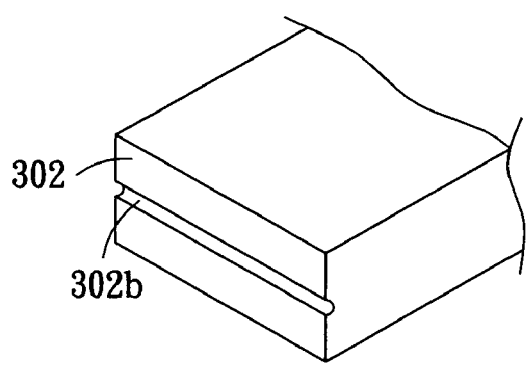
FIG. 6B is a cross-sectional view of a cap-like heat spreader with another grounding portion according to FIG. 5.
Figure 6C:
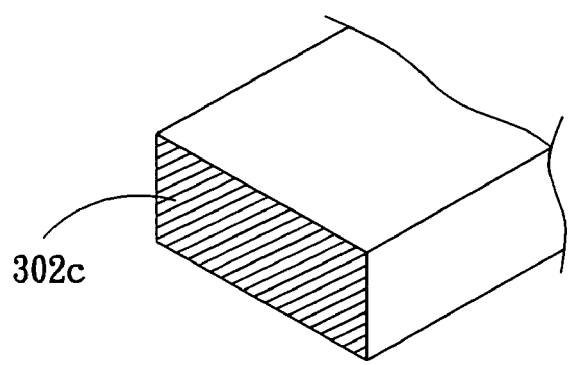
FIG. 6C is a cross-sectional view of a cap-like heat spreader with another grounding portion according to FIG. 5.

As mentioned above, not only the supporting portion 351 is attached to the first chip 312 via a thermally conductive adhesive but also the alignment portion 352 of the cap-like heat spreader 35 connects the first substrate 311, the second substrate 312 and the side 30 of the intermediate substrate 30. Because the first substrate 311, the second substrate 321 and the side 302 of the intermediate substrate 30 has a grounding portion for electrically grounding to the alignment portion 352 of the cap-like heat spreader 35 so as to provide the first chip 312 and the second chip 322 a shielding device to shield against the outside and provide another heat dissipation path for upgrading the thermal performance of the assembly package. Therein, the side 302 of the intermediate substrate 30 has a recessed portion 302a as shown in FIG. 6A, a circuit trace 302b as shown in FIG. 6B or a metal layer 302c as shown in FIG. 6C to be a grounding portion. In addition, the recessed portion 302a, the circuit trace 302b or the metal layer can be covered by another metal layer by plating method, for example a silver metal layer and a nickel metal layer. Similarly, the first substrate 311 and the second substrate 312 have a first side and a second side respectively for electrically grounding to the cap-like heat spreader.

Moreover, the above-mentioned first assembly package or second assembly package may be a package in a wire-bond type. In other words, the first chip and the second chip may be wire-bonded to the first substrate and the second substrate respectively. Therein, the first assembly package 31 further comprises a first solder balls 313 formed on the lower surface of the first substrate 311 for electrically connecting to the intermediate substrate 30. The intermediate substrate 30 has a third solder balls 33 on the lower surface for electrically connecting to the first assembly package 31 and the second assembly package 32 through the first substrate 311 and the second substrate 321. And the second assembly package 32 further has a second solder balls 323 formed on the lower surface of the second substrate 321 for transmitting the electrical signals from the first assembly package 31 and the second assembly package 32 to external electronic devices though the intermediate substrate 30. Because the cap-like heat spreader 35 can align the first solder balls 313 with the pads of the first substrate 311 and the third solder balls 33 with the pads of the second substrate 321 so as to make the first assembly package 31, the second package 32 and the intermediate substrate 30 connect with each other in one reflowing process and simplify the manufacturing process.

Although the invention has been described in considerable detail with reference to certain preferred embodiments, it will be appreciated and understood that various changes and modifications may be made without departing from the spirit and scope of the invention as defined in the appended claims.

What is claimed is:

1. A thermal enhance multi-chips module package, comprising:

a first carrier; a first assembly package disposed on and electrically connected to the first carrier; an intermediate substrate disposed below the first carrier and electrically connected to the first carrier; a second assembly package disposed below the first carrier; a second carrier attached to the second assembly package and electrically connected to the second assembly package and the intermediate substrate; and a cap-like heat spreader having an alignment portion and a supporting portion connecting to the alignment portion so as to define a cavity for covering the first assembly package, the first carrier, the intermediate substrate, the second assembly package and the second carrier, wherein the alignment portion of the cap-like heat spreader is connected to the intermediate carrier, the first carrier and the second carrier, the first carrier has a first side, and the first side has a first grounding portion electrically grounded to the alignment portion of the cap-like heat spreader, the second carrier has a second side, and the second side has a second grounding portion electrically grounded to the alignment portion of the cap-like heat spreader, the intermediate substrate has a third side and the third side has a third grounding portion electrically grounded to the alignment portion of the cap-like heat spreader.

2. The thermal enhance multi-chips module package of claim 1, wherein the intermediate substrate further has an opening accommodating the second assembly package.

3. The thermal enhance multi-chips module package of claim 1, further comprising a first solder ball formed between the first carrier and the intermediate substrate and connecting the first carrier to the intermediate substrate.

4. The thermal enhance multi-chips module package of claim 1, further comprising a second solder ball attached to the second carrier.

5. The thermal enhance multi-chips module package of claim 1, further comprising a third solder ball formed between the second carrier and the intermediate substrate and connecting the second carrier to the intermediate substrate.

6. The thermal enhance multi-chips module package of claim 1, wherein the supporting portion of the cap-like heat spreader is connected to the first assembly package.

7. The thermal enhance multi-chips module package of claim 1, wherein the first grounding portion is a metal layer.

8. The thermal enhance multi-chips module package of claim 1, wherein the first grounding potion is a recessed portion.

9. The thermal enhance multi-chips module package of claim 1, wherein the first assembly package is a ball grid array package.

10. The thermal enhance multi-chips module package of claim 1, wherein the first assembly package is a leadless assembly package.

11. The thermal enhance multi-chips module package of claim 10, wherein the leadless assembly package is mounted to the first carrier by surface mount technology.

12. The thermal enhance multi-chips module package of claim 6, further comprising a thermally conductive adhesive interposed between the first assembly package and the supporting portion of the cap-like heat spreader.

* * * * *